US008681085B2

(12) United States Patent
Kitagishi

(10) Patent No.: US 8,681,085 B2
(45) Date of Patent: Mar. 25, 2014

(54) SHIFT REGISTER CIRCUIT, SCANNING LINE DRIVING CIRCUIT, AND DISPLAY DEVICE

(75) Inventor: Yoichi Kitagishi, Kanagawa (JP)

(73) Assignee: NLT Technologies, Ltd., Kanagawa (JP)

( * ) Notice: Subject to any disclaimer, the term of this patent is extended or adjusted under 35 U.S.C. 154(b) by 493 days.

(21) Appl. No.: 12/898,228

(22) Filed: Oct. 5, 2010

(65) Prior Publication Data

US 2011/0080385 A1    Apr. 7, 2011

(30) Foreign Application Priority Data

Oct. 7, 2009    (JP) ................................. 2009-233892

(51) Int. Cl.
*G09G 3/36* (2006.01)

(52) U.S. Cl.
USPC ............................... 345/100; 345/98; 345/99

(58) Field of Classification Search
USPC .............................................. 345/98, 99, 100
See application file for complete search history.

(56) References Cited

U.S. PATENT DOCUMENTS

| 5,859,630 | A | 1/1999 | Huq | |
|---|---|---|---|---|
| 5,953,003 | A | 9/1999 | Kwon et al. | |
| 6,390,928 | B1 * | 5/2002 | Welschof et al. | 464/140 |
| 6,876,353 | B2 | 4/2005 | Morosawa et al. | |
| 7,038,653 | B2 * | 5/2006 | Moon | 345/100 |
| 7,369,111 | B2 * | 5/2008 | Jeon et al. | 345/100 |
| 7,477,226 | B2 | 1/2009 | Kim et al. | |
| 7,936,331 | B2 | 5/2011 | Uh et al. | |
| 2006/0279511 | A1 | 12/2006 | Uh et al. | |
| 2008/0012842 | A1 * | 1/2008 | Mori | 345/206 |
| 2008/0062112 | A1 * | 3/2008 | Umezaki | 345/100 |
| 2010/0201812 | A1 * | 8/2010 | McGibney et al. | 348/143 |

FOREIGN PATENT DOCUMENTS

| CN | 1240043 | 12/1999 |
|---|---|---|
| CN | 1229813 | 11/2005 |
| CN | 1705042 | 12/2005 |
| JP | 64-59335 | 3/1989 |
| JP | 2006-343746 | 12/2006 |
| JP | 2006-351171 | 12/2006 |
| JP | 2008-020675 | 1/2008 |
| JP | 4069648 | 1/2008 |
| JP | 2008-276849 | 11/2008 |
| JP | 2009-042899 | 2/2009 |

OTHER PUBLICATIONS

JP Office Action dated Aug. 27, 2013, with partial English translation; Application No. 2009-233892.
Chinese Official Action—2010-102989941—Dec. 3, 2013.

* cited by examiner

*Primary Examiner* — Dwayne Bost
*Assistant Examiner* — Robert Michaud
(74) *Attorney, Agent, or Firm* — Young & Thompson

(57) ABSTRACT

A one-stage shift register includes: a first transistor with a drain electrode connected to a corresponding scanning line and with a source electrode connected to a power supply; a second transistor of a same conductivity type, with a drain electrode connected to a gate electrode of the first transistor, with a source electrode connected to the power supply, and with a gate electrode connected to a first external control signal line; a third transistor of the same conductivity type as the fist transistor, with a drain electrode connected to the drain electrode of the second transistor, with a source electrode connected to the power supply, and with a gate electrode connected to a node that uses a bootstrap effect; and a load circuit with one end thereof connected to a second external control signal line and the other end thereof connected to the drain electrode of the second transistor.

15 Claims, 14 Drawing Sheets

SHIFT REGISTER CIRCUIT, SCANNING LINE DRIVING CIRCUIT, AND DISPLAY DEVICE

TECHNICAL FIELD

Reference to Related Application

This application is based upon and claims the benefit of the priority of Japanese patent application No. 2009-233892, filed on Oct. 7, 2010, the disclosure of which is incorporated herein in its entirety by reference thereto.

The present invention relates to a shift register circuit, a scanning line driving circuit, and a display device. More specifically, the invention relates to a shift register circuit and a scanning line driving circuit in which a scanning line of a display device is brought into a floating state (hereinafter referred to as a high-impedance state or the floating state) for a predetermined period, and the display device including the scanning line driving circuit.

BACKGROUND

In medium-sized or large-sized liquid crystal display devices, thin-film transistors (TFTs: Thin Film Transistors) formed of non-crystalline silicon (hereinafter referred to as amorphous silicon) on a glass substrate are used for pixel switches.

In a related-art liquid crystal display device, the TFTs are used only for the pixel switches, and a semiconductor chip is used for each of a scanning line driving circuit for driving a scanning line and a signal line driving circuit for driving a signal line. This semiconductor chip is mounted on a flexible printed circuits (FPC: Flexible Printed Circuits) board or a flexible cable for transmitting a signal to the display device from an externally mounted printed circuit board or from a printed circuit board.

However, in recent years, reduction of the costs of a semiconductor IC and the printed circuit board and the cost of mounting the semiconductor IC and the printed circuit board is considered in order to reduce the manufacturing cost of the liquid crystal display device.

There is a method in which using TFTs formed of amorphous silicon, the scanning line driving circuit is included on the glass substrate of the display device, for example. According to this method, during the course of forming the TFTs on the glass substrate, the scanning line driving circuit as well as the pixel switches can be manufactured. Accordingly, the need for the semiconductor chip for the scanning line driving circuit and the need for the flexible cable for transmitting to the display device a pulse for driving a scanning line are eliminated. The need for a device and a step for mounting these semiconductor chip and flexible cable is also eliminated. As described above, by including the scanning line driving circuit on the glass substrate using the TFTs, the manufacturing cost of the display device itself is reduced.

In general, the scanning line driving circuit formed of the TFTs is formed of transistors of a single conductivity type (or a single channel). It is because, with this arrangement, the number of steps associated with channel characteristics can be reduced by approximately half. Reduction of the cost can be thereby achieved. As an example, Patent Document 1 describes a single channel driving circuit using amorphous silicon TFTs.

Further, each of Patent Documents 2 to 4 describes that a function of bringing a scanning line of a liquid crystal display device into a high-impedance state is demanded for a scanning line driving circuit.

Patent Document 2 describes a display device including a function of switching the scanning direction of a gate line. This display device includes two scanning line driving circuits each formed of amorphous silicon TFTs. This display device uses a method in which one scanning line driving circuit is brought into a high-impedance state and the other scanning line driving circuit is brought into an active state.

Patent Document 3 describes a display device in which, when a defective portion such as a line disconnection is included in a gate line or when one of stages of a gate driving unit does not function, a normal function of the display device can be swiftly recovered just by a simple repair. This display device includes a main gate driving unit and a sub gate driving unit. Then, switching units are provided. Usually, the sub gate driving portion is brought into a high-impedance state. When a defect is found, one of the switching units connected to the portion of the defect is turned on.

Patent Document 4 describes a display device of a touch sensor incorporated type suitable for reduction of weight, size, and thickness. This display device has a feature in which a scanning line is brought into a high-impedance state.

PATENT DOCUMENTS

Patent Document 1:
JP Patent No. 4069648
Patent Document 2:
JP Patent Kokai Publication No. JP-P-2008-020675A
Patent Document 3:
JP Patent Kokai Publication No. JP-P-2006-343746A
Patent Document 4:
JP Patent Kokai Publication No. JP-P-2009-042899A

SUMMARY

The entire disclosures of the above mentioned Patent Documents are incorporated herein by reference thereto. The following analyses are given by the present invention.

However, the method of bringing a scanning line into a high-impedance state, described in each of Patent Document 2 to 4 has the following problems.

The method described in Patent Document 2 is the one in which the scanning line is brought into a high-impedance state using N-channel and P-channel TFTs (of a so-called CMOS type), and is not a method of bringing the scanning line into a high-impedance state using the circuit of a single conductivity type.

On the other hand, Patent Document 3 describes the method of disconnecting an output of the scanning line driving circuit of the single conductivity type by a TFT switch. This method, however, has the following problem.

First, there is a problem that driving capability of the scanning line driving circuit is reduced, and a rise or a fall of an output pulse of the scanning line driving circuit is delayed. This delay is caused because each amorphous silicon TFT, in particular, has a high on-resistance, so that a load that will be driven by the scanning line driving circuit increases.

Second, there is a problem that a contrast of a liquid crystal display is reduced. This problem arises because the rise or fall of the output pulse of the scanning line driving circuit is delayed, and an on time of each pixel TFT is reduced, so that a voltage applied to a liquid crystal is reduced.

Third, there is a problem that image quality degradation such as reduction of the contrast of the liquid crystal display occurs gradually. A same voltage stress is applied to switch TFTs for almost all periods, and TFT characteristics such as the threshold value of each switch TFT vary time-dependently.

Although Patent Document 4 describes bringing the scanning line into a high-impedance state, Patent Document 4 does not describe a specific method of bringing the scanning line into a high-impedance state in the scanning line driving circuit.

Therefore, there is a need in the art to provide a shift register circuit, a scanning line driving circuit, and a display device in order to bring a scanning line into a high-impedance state by transistors of a single conductivity type and to thereby improve rise and fall characteristics of a pulse.

According to a first aspect of the present invention, there is provided a one-stage shift register comprising:
a first transistor with a drain electrode thereof connected to a corresponding one of scanning lines and with a source electrode thereof connected to a power supply;
a second transistor of a same conductivity type as the first transistor, with a drain electrode thereof connected to a gate electrode of the first transistor, with a source electrode thereof connected to the power supply, and with a gate electrode thereof connected to a first external control signal line;
a third transistor of the same conductivity type as the fist transistor, with a drain electrode thereof connected to the drain electrode of the second transistor, with a source electrode thereof connected to the power supply, and with a gate electrode thereof connected to a node that uses a bootstrap effect; and
a load circuit with one end thereof connected to a second external control signal line and the other end thereof connected to the drain electrode of the second transistor.

The present invention provides the following advantage, but not restricted thereto. According to the shift register circuit and the scanning line driving circuit and the display device each including the shift register circuit according to the present invention, a scanning line is brought into a high-impedance state by the transistors of the single conductivity type, and rise and fall characteristics of a pulse can be thereby improved.

PREFERRED MODES

Figure 1:
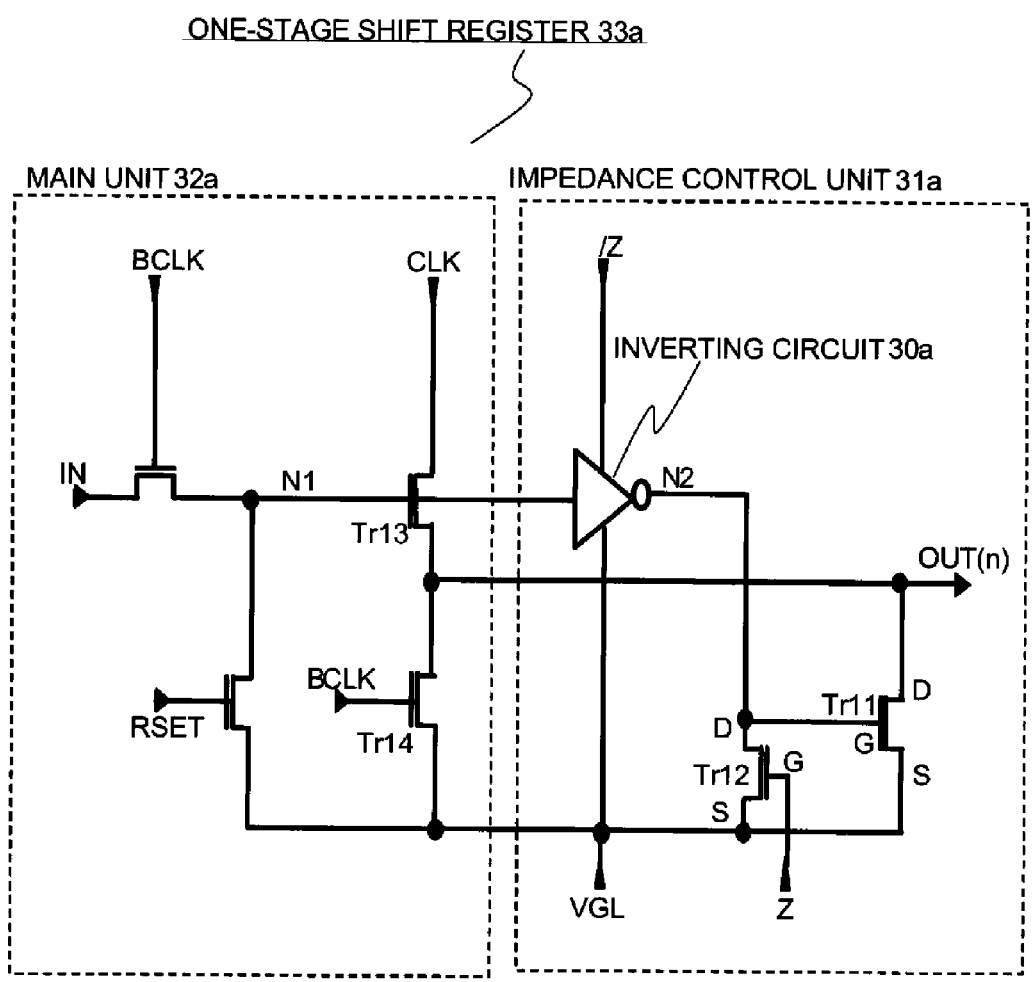
FIG. 1 is a circuit diagram showing a configuration of a one-stage shift register according to a first exemplary embodiment.

In the present disclosure, there are various possible modes, which include the following, but not restricted thereto. Preferably, a one-stage shift register in a first mode is the one-stage shift register according to the first aspect.

In the one-stage shift register in a second mode, the load circuit may comprise a fourth transistor of the same conductivity type as the first transistor, with a drain electrode thereof and a gate electrode thereof both connected to the second external control signal line and with a source electrode thereof connected to the drain electrode of the second transistor.

Preferably, the one-stage shift register in a third mode further includes a fifth transistor of the same conductivity type as the first transistor, with a drain electrode thereof connected to the gate electrode of the third transistor, with a source electrode thereof connected to the power supply, and a gate thereof connected to the drain electrode of the third transistor.

In the one-stage shifter in a fourth mode, preferably, mutually complementary signals are respectively supplied to the first external control signal line and the second external control line to control an impedance of the corresponding one of scanning lines.

Preferably, a shift register (comprising a plurality of stages, the same as below) in a fifth mode includes a plurality of the above-mentioned one-stage shift registers.

Preferably, a shift register in a sixth mode includes the one-stage shift register in each stage.

Preferably, a scanning line driving circuit in a seventh mode includes the above-mentioned shift register.

Preferably, a display device in an eighth mode includes the scanning line driving circuit.

In the display device in a ninth mode, two of the scanning line driving circuits may be connected for each of the scanning lines.

In the display device in a tenth mode, scanning directions of the two scanning line driving circuits may be disposed to be opposite to each other.

In the display device in an eleventh mode, preferably, the two scanning line driving circuits are disposed to face to each other with a display area sandwiched therebetween, and one of the two scanning line driving circuits is driven active, the scanning lines being wired in the display area.

In the display device in a twelfth mode, preferably, a scanning direction of the display device is reversed, using the first and second external control signal lines.

The display device in a thirteenth mode may detect a position touched by a finger in the display area of the display device.

A scanning line driving method in a fourteenth mode includes: controlling signals supplied respectively to the first and second external control signal lines; and bringing a scanning line of the display device into a floating state.

First Exemplary Embodiment

A one-stage shift register according to a first exemplary embodiment will be described with reference to the drawings. The one-stage shift register is herein defined to be a circuit that constitutes each shift register stage. Herein, a description will be directed to a case where the shift register circuit is formed of N-channel TFTs alone.

Figure 13:
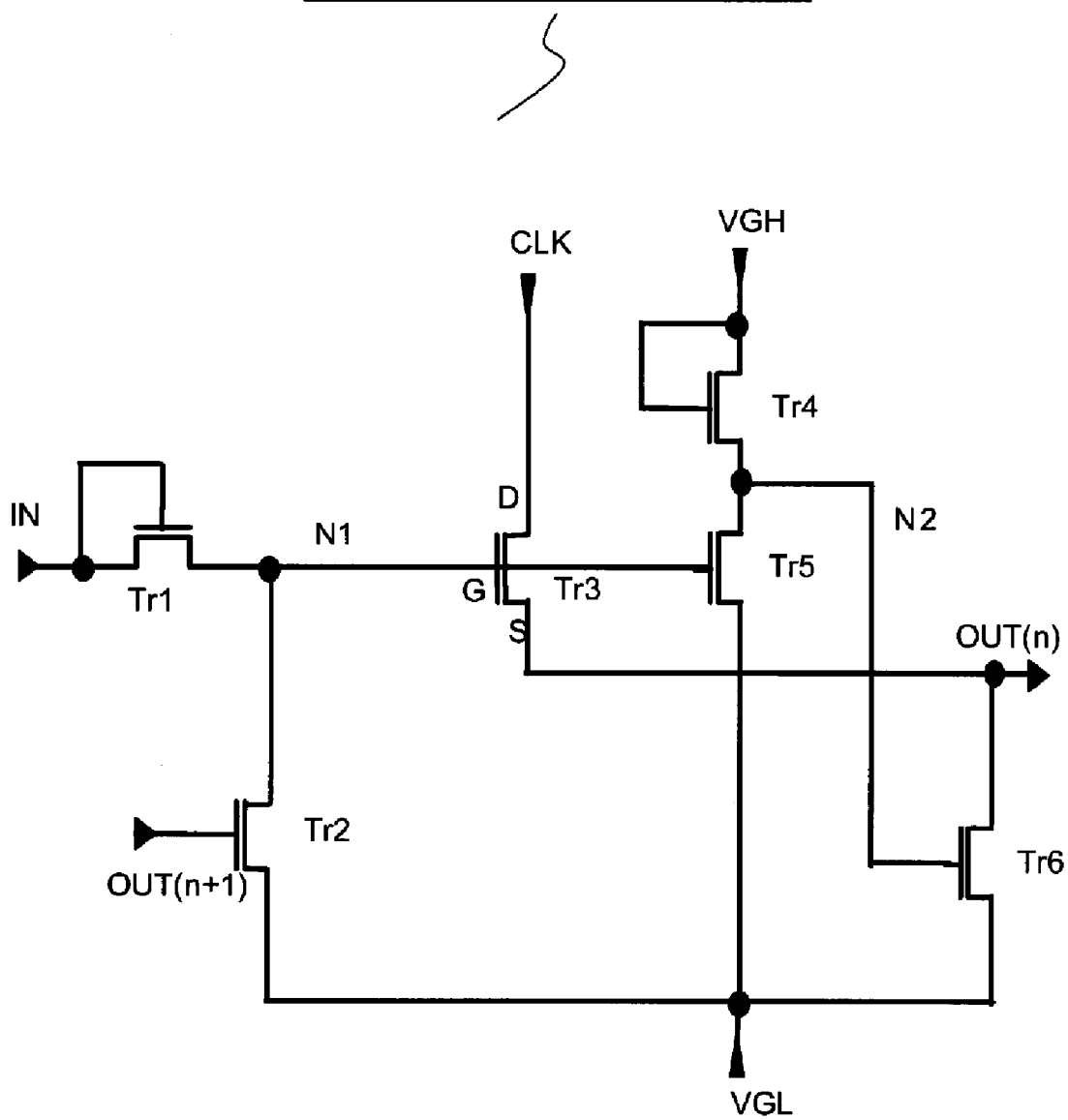
FIG. 13 is a circuit diagram showing a related-art one-stage shift register.

First, a one-stage shift register described in Patent Document 1 will be described with reference to the drawings. FIG. 13 is a circuit diagram showing a configuration of a one-stage shift register 133 in Patent Document 1. Referring to FIG. 13, the one-stage shift register 133 includes transistors Tr1 to Tr6. The transistors Tr1 to Tr6 are amorphous silicon TFTs of a single conductivity type. The one-stage shift register 133 outputs a pulse using a bootstrap effect.

Figure 14:
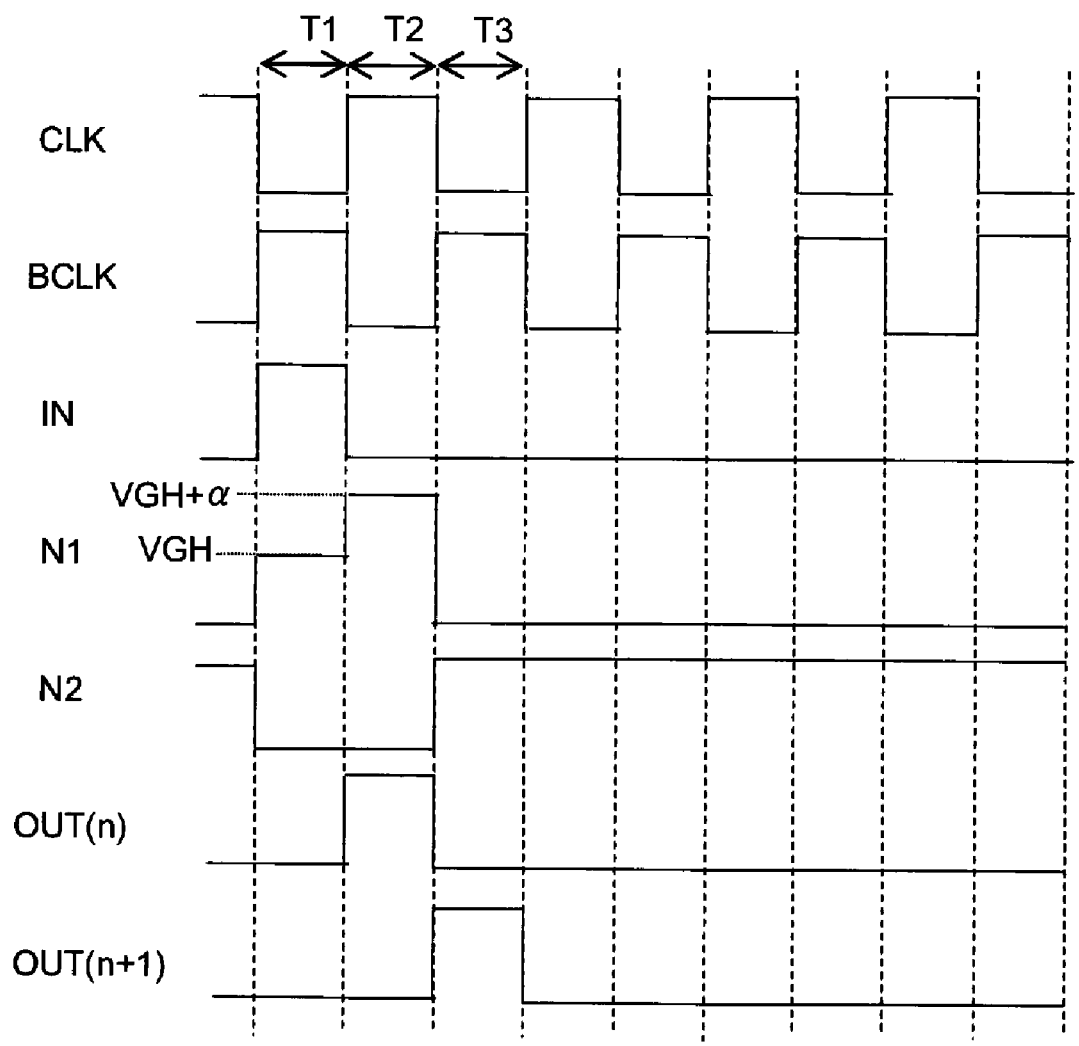
FIG. 14 is a timing chart showing an operation of the related-art one-stage shift register.

FIG. 14 is a timing chart showing an operation of the one-stage shift register 133. First, the operation of the one-stage shift register 133 will be described with reference to the circuit diagram (in FIG. 13) and the timing chart (in FIG. 14).

When the pulse is supplied to the one-stage shift register 133, a high-level voltage is written to a node N1 (refer to a period T1 in FIG. 14). The period T1 is referred to as a set period. Since a drain electrode D of the transistor Tr3 is at a low level at this point, a potential difference is produced between the drain electrode D and a gate electrode G (between D–G) of the transistor Tr3.

When a clock signal CLK rises from low to high in a next phase, the potential at the node N1 rises to VGH or higher (indicated by VGH+α in FIG. 14) with the (D–G) potential difference of the transistor Tr3 maintained (refer to a period T2 in FIG. 14) because the gate electrode G of the transistor Tr3 is in a floating state (and a transistor Tr1 is in an off state). The period T2 is referred to as a bootstrap period. When the gate voltage of the transistor Tr3 is not less than the threshold of the transistor Tr3, the pulse (at a high level) is output to a scanning line OUT(n). An effect in which the voltage is raised to be not less than the threshold value with the gate electrode G maintained in the floating state in this manner is referred to as the bootstrap effect. The node N1 of which the potential is raised to be not less than the voltage VGH is referred to as a bootstrap node. FIG. 13 does not illustrate a capacitor used for the bootstrap effect.

In a next phase, an output pulse OUT(n+1) in a next stage is used to discharge electric charges, in order to reduce the potential that has risen due to the bootstrap effect to VGL. Specifically, the transistor Tr2 in FIG. 13 is turned on to reduce the potential at the node N1 to VGL (refer to a period T3 in FIG. 14). The period T3 is referred to as a reset period.

Next, a description will be directed to a configuration in which an output of the one-stage shift register 133 formed of the transistors of a single conductivity type is brought into a high-impedance state, with reference to a drawing. FIG. 1 is a circuit diagram showing a configuration of a one-stage shift register 33a in the present exemplary embodiment. It is assumed that the one-stage shift register 33a in the present exemplary embodiment outputs a pulse, using the bootstrap effect, as in Patent Document 1.

Referring to FIG. 1, the one-stage shift register 33a in the present exemplary embodiment is obtained by adding an impedance control unit 31a to a main unit 32a of the one-shift register of the single conductivity type. The impedance control unit 31a includes transistors Tr11 and Tr12 and an inverting circuit 30a.

A drain electrode D of the transistor Tr11 is connected to a scanning line OUT(n), and a source electrode S of the transistor Tr11 is connected to a low-voltage power supply (VGL in FIG. 1). A drain electrode D of the transistor Tr12 is connected to a gate electrode G of the transistor Tr11, and a source electrode S of the transistor Tr12 is connected to the low-voltage power supply VGL. An external control signal (Z in FIG. 1) is supplied to a gate electrode G of the transistor Tr12.

The inverting circuit 30a receives a signal (/Z in FIG. 1) obtained by inverting the external control signal Z. An output of the inverting circuit 30a is connected to the drain electrode of the transistor Tr12 and the gate electrode of the transistor Tr11. The inverting circuit 30a inverts a node N1 (node of which the voltage is raised to a high voltage due to the bootstrap effect). When the external control signal /Z is high, the inverting circuit 30a operates as a circuit (so-called inverting circuit) that outputs to a node N2 a signal obtained by inverting a signal at the node N1. On the other hand, when the external control signal /Z is low, the inverting circuit 30a operates so that the node N2 goes low or assumes a high-impedance state.

The one-stage shift register to which the impedance control unit 31a has been added as described above brings an output of the one-stage shift register into a high-impedance state by the following driving method.

That is, the high level is applied to the external control signal Z, and the low level is applied to the external control signal /Z obtained by inverting the external control signal Z, thereby fixing both of clock signals CLK and BCLK at a low level.

In this case, the output of the inverting circuit 30a is low or in a high-impedance state. The transistor Tr 12 is in an on state. Thus, the node N2 goes low. Further, after a pulse is output, a pulse is applied to a terminal RSET. Thus, the node N1 also goes low. Accordingly, the transistor Tr11 and transistors Tr13 and Tr14 connected to the scanning line OUT(n) all turn off. The scanning line OUT(n) assumes a high-impedance state.

According to the present exemplary embodiment, the following effects are brought about. First, image quality degradation such as display contrast reduction can be prevented. It is because the need for providing a new switch TFT on the scanning line in series is eliminated, and a load resistance is not thereby increased.

Second, a shift register with high reliability, in which a voltage stress is reduced, can be provided. When the switch TFT is provided in series with the scanning line, the switch TFT is kept in the on-state except for a short period in which the scanning line is brought into the floating state. In this state, a voltage stress is applied to this switch TFT. According to the present exemplary embodiment, the need for providing the switch TFT in series with the scanning line is eliminated. Thus, there is no TFT that is placed in a state of voltage stress application, and a voltage stress is difficult to be applied to each TFT used within the circuit. Accordingly, image quality degradation due to a change in TFT characteristics caused by the voltage stress can be prevented.

Third, the manufacturing cost of a liquid crystal display device can be reduced. The reason for this reduction is as follows. The shift register circuit includes only the TFTs of a single conductivity type. Accordingly, the number of process steps can be reduced more than with a CMOS circuit. Further, the need for members of a semiconductor chip and an FPC is eliminated. Further, according to the shift register circuit in the present exemplary embodiment, image quality degradation such as contrast reduction due to reduction of driving capability can be prevented.

Second Exemplary Embodiment

Figure 2:
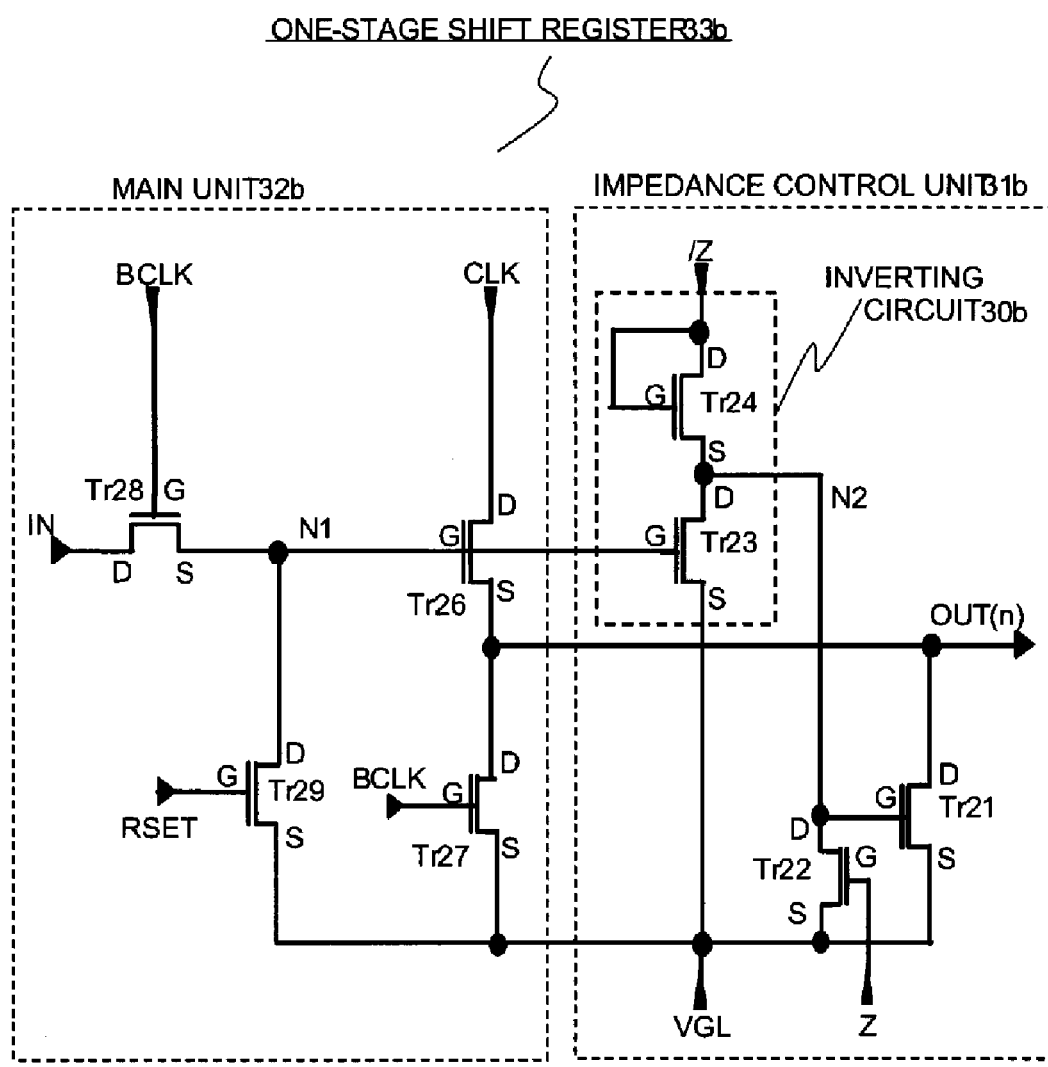
FIG. 2 is a circuit diagram showing a one-stage shift register according to a second exemplary embodiment.

A one-stage shift register according to a second exemplary embodiment will be described with reference to the drawings. FIG. 2 is a circuit diagram showing a configuration of a one-stage shift register 33b according to the present exemplary embodiment. In the present exemplary embodiment, a scanning line is brought into a floating state based on the configuration of the circuit shown in FIG. 2.

Referring to FIG. 2, the one-stage shift register 33b has a configuration in which an impedance control unit 31b is added to a main unit 32b of the one-stage shift register formed of transistors of a single conductivity type. The configuration of the main unit 32b is not limited to the configuration shown in FIG. 2. The impedance control unit 31b has transistors Tr21 to Tr24.

A drain electrode D of the transistor Tr21 is connected to a scanning line OUT(n), and a low-voltage power supply VGL is supplied to a source electrode S of the transistor Tr 21. A drain electrode D of the transistor Tr22 is connected to a gate electrode G of the transistor Tr21. A first external control signal Z is supplied to a gate electrode G of the transistor Tr22. The low-voltage power supply VGL is supplied to a source electrode S of the transistor Tr22. A drain electrode D of the transistor Tr23 is connected to the drain electrode D of the transistor Tr22. A gate electrode G of the transistor Tr23 is connected to a bootstrap node N1 of the shift register formed of the transistors of the signal conductivity type. The low-voltage power supply VGL is supplied to a source electrode S of the transistor Tr23. A second external control signal /Z is supplied in common to a drain electrode D and a gate electrode G of a transistor Tr24, and a source electrode S of the transistor Tr24 is connected to the drain electrode D of the transistor Tr22.

Figure 4:
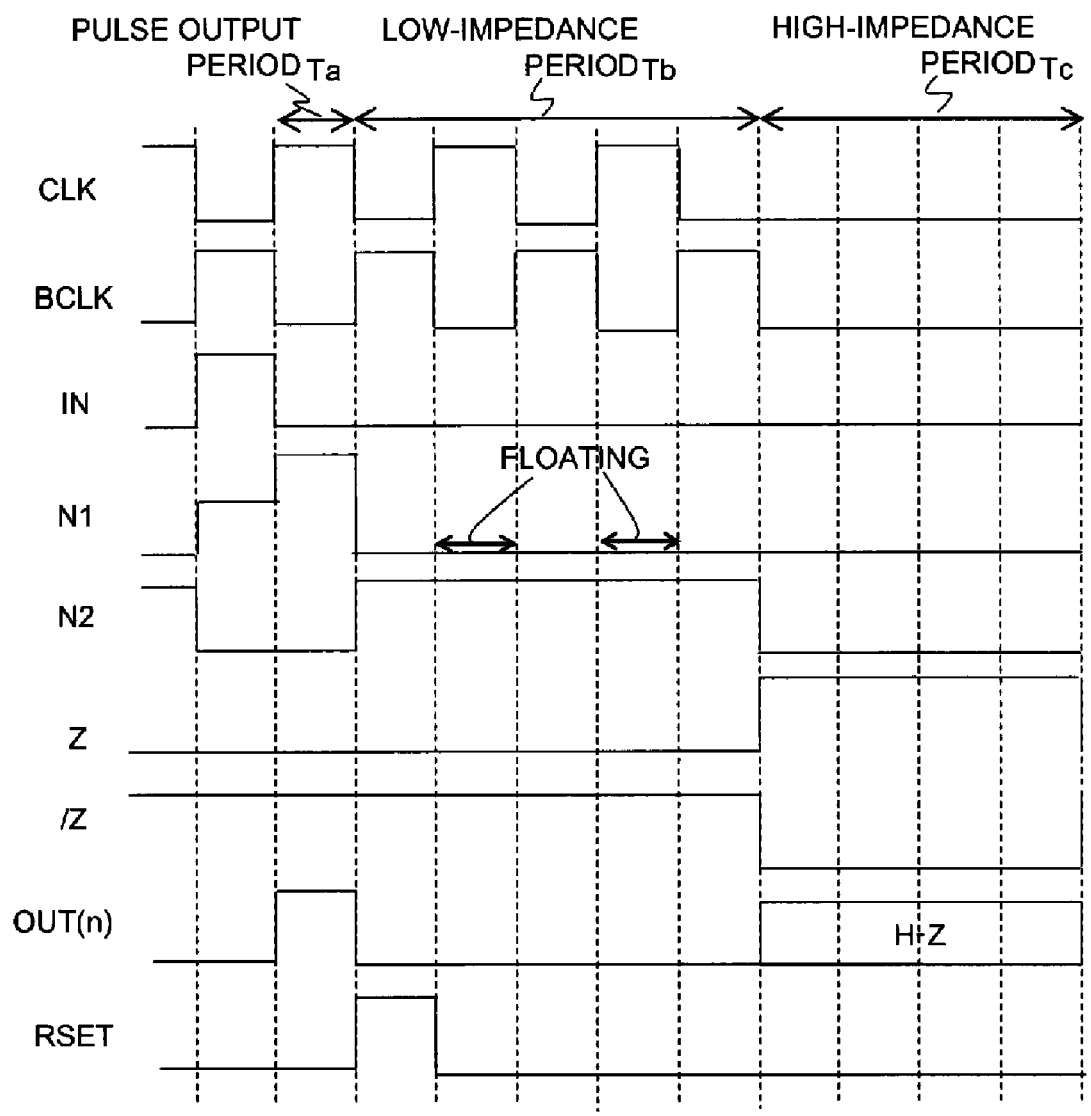
FIG. 4 is a timing chart showing an operation of the one-stage shift register in the second exemplary embodiment.

An operation of the one-stage shift register 33b will be described with reference to the drawings. FIG. 4 is a timing chart showing an operation of the one-stage shift register 33b (in FIG. 2) according to the present exemplary embodiment. An entire period of the timing chart is divided into the following three periods according to the state of the scanning line OUT(n): a period Ta (that is a pulse output period Ta in FIG. 4) in which a pulse is output and the scanning line OUT(n) is in a low-impedance state; a period Tb (that is a low-impedance period Tb in FIG. 4) other than the pulse output period in which the scanning line OUT(n) is in a low-impedance state; and a high-impedance period Tc. Then, the operation of the one-stage shift register 33b will be described.

Referring to FIG. 4, in the periods Ta and Tb, clock signals having different phases are respectively supplied to clock signals CLK and BCLK from an outside, a low level is supplied to the first external control signal Z, a high level is supplied to the second external control signal /Z, an input pulse is supplied to an input signal line IN of the one-stage shift register, and a pulse OUT(n+1), which is an output pulse of a subsequent phase, is supplied to a terminal RSET.

Herein, high-level voltages of the clock signals CLK, BCLK, and the external control signals Z and /Z are set to VGH, and low-level voltages of the clock signals CLK, BCLK, and the external control signals Z and /Z are set to VGL, as an example. When driving as described above is performed, a high level is output to the scanning line OUT(n) in the period Ta due to the bootstrap effect, and a low level is output to the scanning line OUT(n) in the period Tb.

The reason for the outputs as described above is as follows. That is, a potential at the node N1 rises to VGH+α in the period Ta due to the bootstrap effect. Thus, a transistor Tr26 is turned on, and the clock signal CLK at the high level is output. On the other hand, when the clock signal BCLK is high in the period Tb, a transistor Tr27 is turned on, and the low level is output to the scanning line OUT(n).

Figure 3:
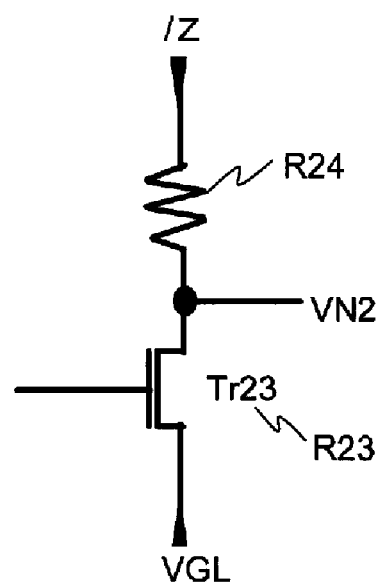
FIG. 3 is a circuit diagram showing an equivalent circuit for an inverting circuit in the one-stage shift register in the second exemplary embodiment.

The impedance control unit 31b operates as follows in the periods Ta and Tb. FIG. 3 is a circuit diagram showing an equivalent circuit for an inverting circuit 30b of the one-stage shift register 33b in the present exemplary embodiment. The inverting circuit 30b including the transistors Tr23 and Tr24 can be expressed by the equivalent circuit as shown in FIG. 3. Accordingly, an output VN2 of the inverting circuit is expressed by the following equation, in which R24 denotes a load resistance, and R23 denotes an on-resistance of the transistor Tr23.

$$VN2 = \frac{R23}{R23 + R24}(VGH - VGL) + VGL$$

When the on resistance of the transistor Tr23 is set so that R23<<R24 holds by changing channel widths of the transistors Tr23 and Tr24, a voltage VN2 of the output of the inverting circuit 30b in the period Ta is approximately equal to the voltage VGL, VN2≈VGH. Accordingly, the transistor Tr21 is turned off, and the high level is output to the scanning line OUT(n) due to turning on of the transistor Tr26.

The transistor Tr23 is turned off in the period Tb. Thus, R23>>R24 holds. Thus, the voltage VN2 of the output of the inverting circuit is approximately equal to the voltage VGH, VN2≈VGH. Accordingly, the transistor Tr21 is turned on, and the low level is output to the scanning line OUT(n).

That is, in the periods Ta and Tb, one of the transistors connected to the scanning line OUT(n) is turned on, and the scanning line OUT(n) assumes a low-impedance state.

In the period Tc, signal supply is performed as follows. Referring to FIG. 4, the signals fixed at the low level are supplied to the clock signals CLK and BCLK, the high level is supplied to the first external control signal Z, and the low level is supplied to the second external control signal /Z.

In this period, the node N1 is low, and the output of the inverting circuit 30b assumes a high-impedance state, and the transistor Tr22 is turned on. The node N2 therefore goes low. As described above, the clock signal BCLK is fixed at the low level. Accordingly, the transistors Tr21, Tr26, and Tr27 connected to the scanning line OUT(n) are all turned off. Accordingly, the scanning line assumes a high-impedance state in the period Tc.

In the present exemplary embodiment, a source-grounded amplifier circuit including the driving transistor (Tr23) and a load element formed of the diode-connected transistor (Tr24) is adopted, as the inverting circuit 30a described in FIG. 1. The configuration of the inverting circuit 30a may be changed as necessary. The load element, for example, may be a resistive element, or a transistor with a gate electrode biased to a predetermined voltage.

Third Exemplary Embodiment

A one-stage shift register according to a third exemplary embodiment will be described with reference to the drawings.

Figure 5:
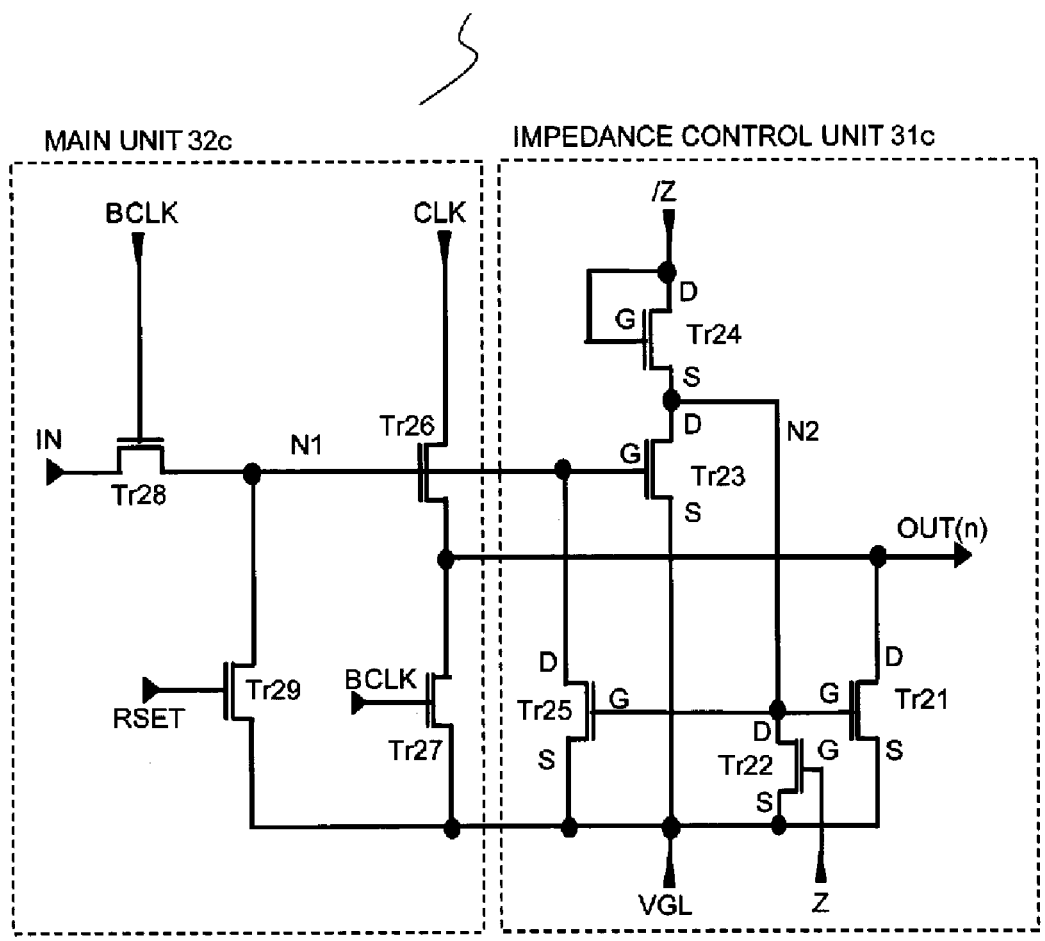
FIG. 5 is a circuit diagram showing a configuration of a one-stage shift register according to a third exemplary embodiment.

FIG. 5 is a circuit diagram showing a configuration of a one-stage shifter register 33c according to the present exemplary embodiment.

Referring to FIG. 5, the one-stage shift register 33c has a configuration in which an impedance control unit 31c is added to a main unit 32c of the one-stage shift register with transistors of a single conductivity type. In the impedance control unit 31c in the present exemplary embodiment, a transistor Tr25 is further provided for the impedance control unit 31b (in FIG. 2) in the second exemplary embodiment.

The transistor Tr25 is a transistor of the same conductivity type as transistors Tr21 to Tr24. A drain electrode D of the transistor Tr25 is connected to a bootstrap node N1 of the main unit 32c, a gate electrode G of the transistor Tr25 is connected to a drain electrode D of the transistor Tr23, and a supply voltage VGL is supplied to a source electrode S of the transistor Tr25.

In the one-stage shift register 33b (FIG. 2) without the transistor Tr25 in the second exemplary embodiment, the bootstrap node N1, which is an internal node, assumes a floating state when the clock signal BCLK goes low, as shown in FIG. 4. When the internal node N1 assumes the floating state, a problem may arise.

That is, since the floating state is a state where no bias is applied, a potential at the node N1 may rise due to external noise or the like, and the transistor Tr26, which is naturally in an off-state, may be turned on. A pulse unnecessary as an output may be occur. Further, when such the one-stage shift register 33b is used for a display device, image quality degradation such as a ghost image may occur, due to the unnecessary output pulse.

Figure 6:
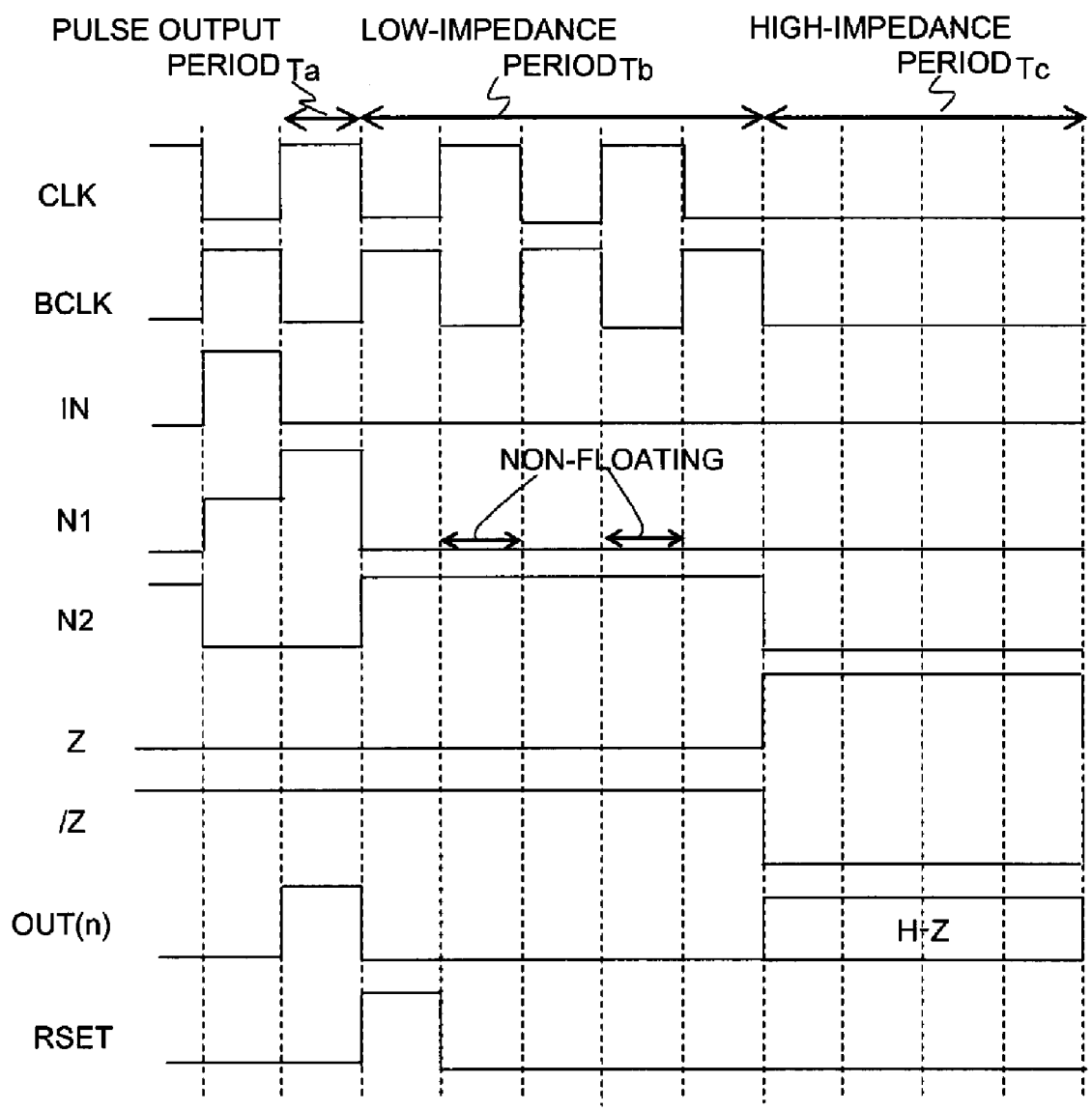
FIG. 6 is a timing chart showing an operation of the one-stage shift register in the third exemplary embodiment.

Then, the transistor Tr25 is provided for the one-stage shift register 33c in the present exemplary embodiment to prevent the node N1 from assuming the floating state. Occurrence of the unnecessary pulse can be thereby prevented (refer to a timing chart in FIG. 6).

That is, according to the one-stage shift register 33c in the present exemplary embodiment, occurrence of an unnecessary pulse caused by external noise can be prevented.

Fourth Exemplary Embodiment

Figure 7:
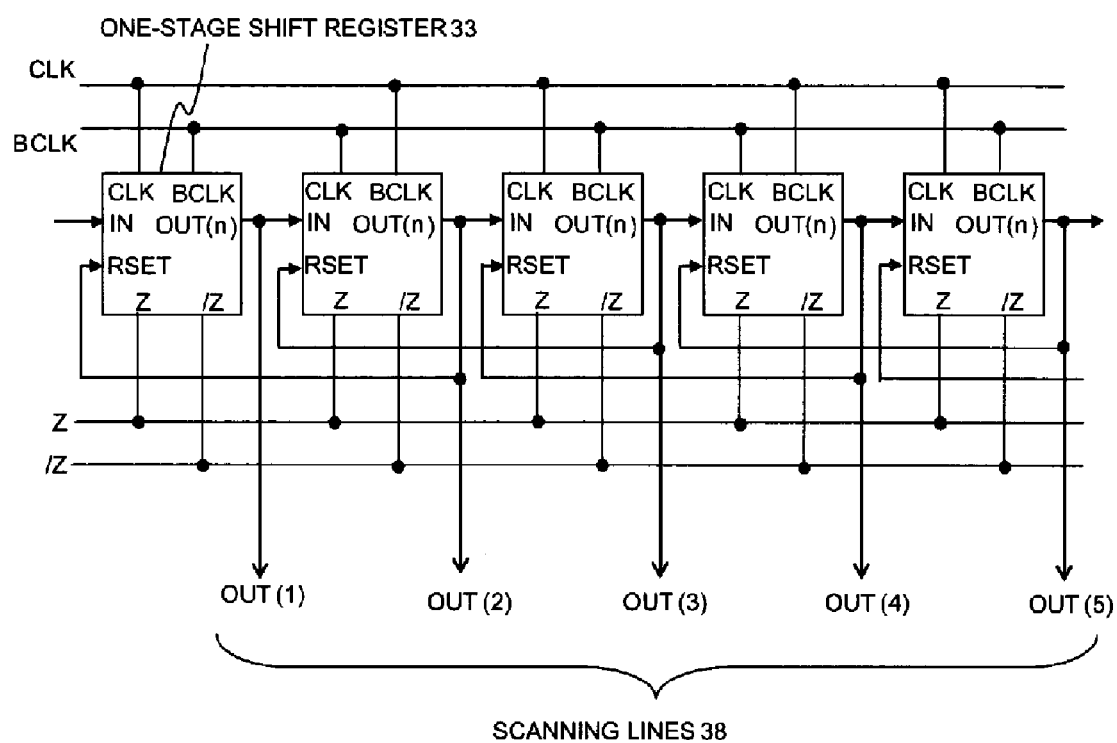
FIG. 7 is a circuit diagram showing a configuration of a shift register according to each of fourth and fifth exemplary embodiments.

A shift register according to a fourth exemplary embodiment will be described with reference to the drawings. FIG. 7 is a circuit diagram showing a configuration of the shift register in the present exemplary embodiment. A one-stage shift register 33 that constitutes each stage of the shift register is the one-stage shift register 33b (in FIG. 2) according to the second exemplary embodiment.

The one-stage shift register 33b includes an impedance control unit 31b and a main unit 32b, and includes an impedance control function. The impedance control unit 31b includes N-channel transistors Tr21 to Tr24, and the main unit 32b of the one-stage shift register includes N-channel transistors Tr26 to Tr29.

A drain electrode D of the transistor Tr21 of the impedance control unit 31b is connected to a corresponding one of scanning lines 38 (OUT(1) to OUT(5)), and a source electrode S of the transistor Tr21 is connected to a low-voltage power supply VGL. A drain electrode D of the transistor Tr22 is connected to a gate electrode G of the transistor Tr21. A gate electrode G of the transistor Tr22 is connected to the signal line of a first external control signal Z. A source electrode S of the transistor Tr22 is connected to the low-voltage power supply VGL. A drain electrode D and a gate electrode G of the transistor Tr24 are connected in common to the signal line of a second external control signal /Z. A drain electrode D of the transistor Tr23 is connected to a source electrode S of the transistor Tr24 and the drain electrode D of the transistor Tr22. A source electrode S of the transistor Tr23 is connected to the low-voltage power supply VGL, and a gate electrode G of the transistor Tr23 is connected to a bootstrap node N1.

On the other hand, a drain electrode D of the transistor Tr26 of the main unit 32b is connected to the signal line of a clock signal CLK, a source electrode S of the transistor Tr26 is connected to a scanning line 38 (OUT(n)), and a gate electrode G of the transistor Tr26 is connected to the bootstrap node N1. A drain electrode D of the transistor Tr27 is connected to the source electrode S of the transistor Tr26, and a source electrode S of the transistor Tr27 is connected to the low-voltage power supply VGL, and a gate electrode G of the transistor Tr27 is connected to the signal line of a clock signal BCLK. A drain electrode D of the transistor Tr28 is connected to an input signal line IN, a source electrode S of the transistor Tr28 is connected to the bootstrap node N1, and a gate electrode G of the transistor Tr28 is connected to the signal line of the clock signal BCLK. A drain electrode D of the transistor Tr29 is connected to the bootstrap node N1, a source electrode S of the transistor Tr29 is connected to the low-voltage power supply VGL, and a gate electrode G of the transistor Tr29 is connected to a scanning line 38 (OUT(n+1)) of a subsequent stage.

Figure 8:
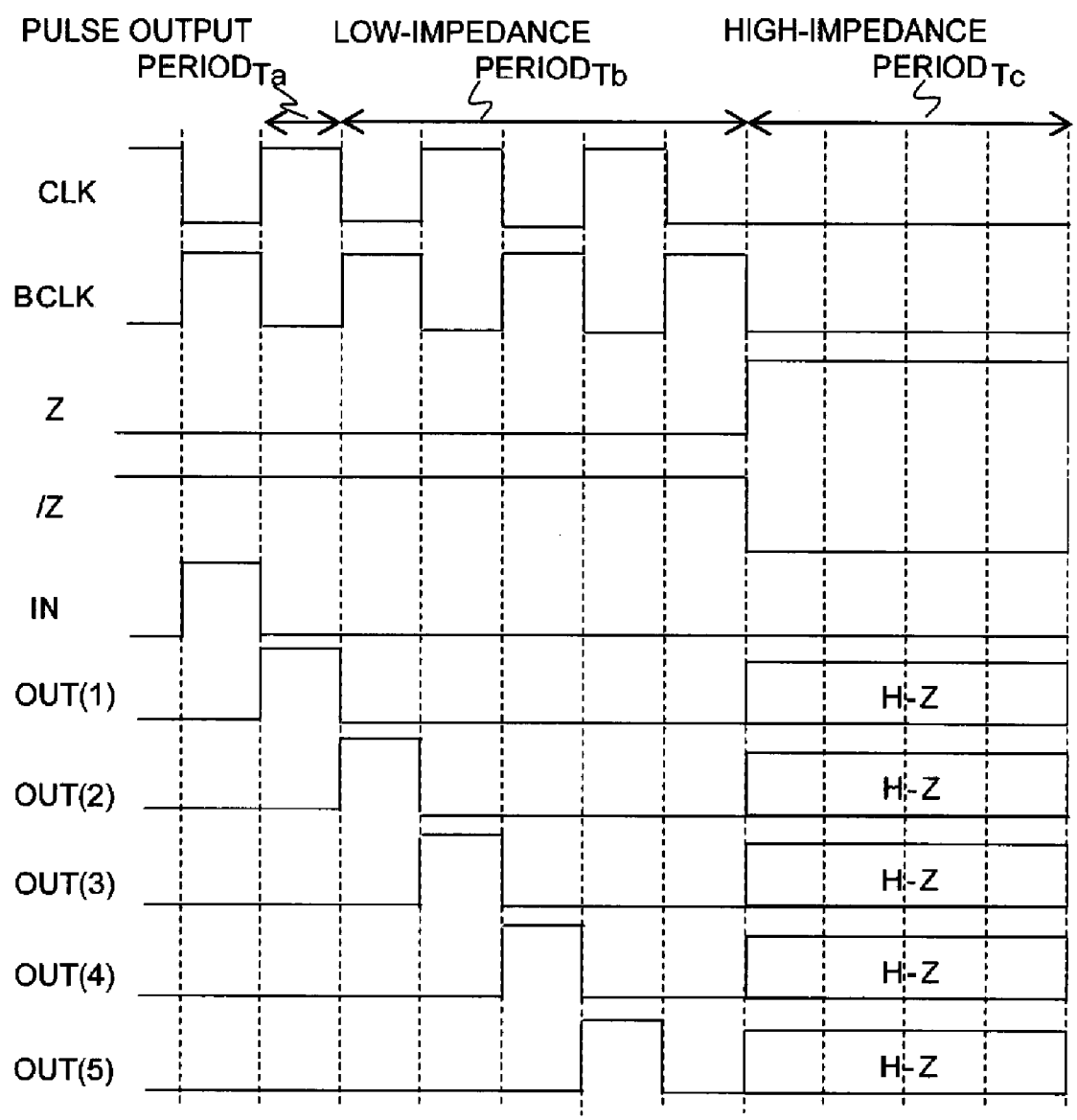
FIG. 8 is a timing chart showing an operation of the shift register in each of the fourth and fifth exemplary embodiments.

FIG. 8 is a timing chart showing an operation of the shift register in the present exemplary embodiment. Referring to FIG. 8, in a pulse output period Ta and a low-impedance period Tb, the first external control signal Z is driven low, and the second external control signal /Z is driven high. In a high-impedance period Tc, the first external control signal Z is driven high, and the second external control signal /Z is driven low. Referring to FIG. 8, all the scanning lines assume a high-impedance state (H-Z) in the period Tc.

Fifth Exemplary Embodiment

A shift register according to a fifth exemplary embodiment will be described with reference to the drawings. FIG. 7 is a circuit diagram showing a configuration of the shift register according to the present exemplary embodiment. A one-stage shift register 33 that constitutes each stage of the shift register in the present exemplary embodiment is the one-stage shift register 33c (in FIG. 5) according to the third exemplary embodiment.

The one-stage shift register 33c includes an impedance control unit 31c and a main unit 32c, and includes an impedance control function. Referring to FIG. 5, components to which the same reference numerals as those in FIG. 2 have been assigned indicate components that are the same as those in FIG. 2. Thus, description of these components will be omitted. The impedance control unit 31c in FIG. 5 is obtained by adding a transistor Tr25 to the impedance control unit 31b in FIG. 2. A drain electrode D of the transistor Tr25 is connected to a bootstrap node N1, a source electrode S of the transistor Tr25 is connected to a low-voltage power supply VGL, and a gate electrode G of the transistor Tr25 is connected to a drain electrode D of a transistor Tr23, a drain electrode D of a transistor Tr22, and a gate electrode G of a transistor Tr21.

The transistor 25 brings about the following effect. A voltage obtained by inverting a voltage at the bootstrap node N1 is applied to the gate electrode G of the transistor Tr25. That is, a high level is applied to the gate electrode G of the transistor Tr25 in a period other than a bootstrap period and a set period before the bootstrap period, and the transistor Tr25 is turned on. That is, the internal node N1 is biased to the low-voltage power supply in periods other than the bootstrap period in which a floating state is needed. With this arrangement, an increase in voltage in the periods other than the bootstrap period can be prevented, and output of an unnecessary pulse can be prevented.

Sixth Exemplary Embodiment

Figure 9:
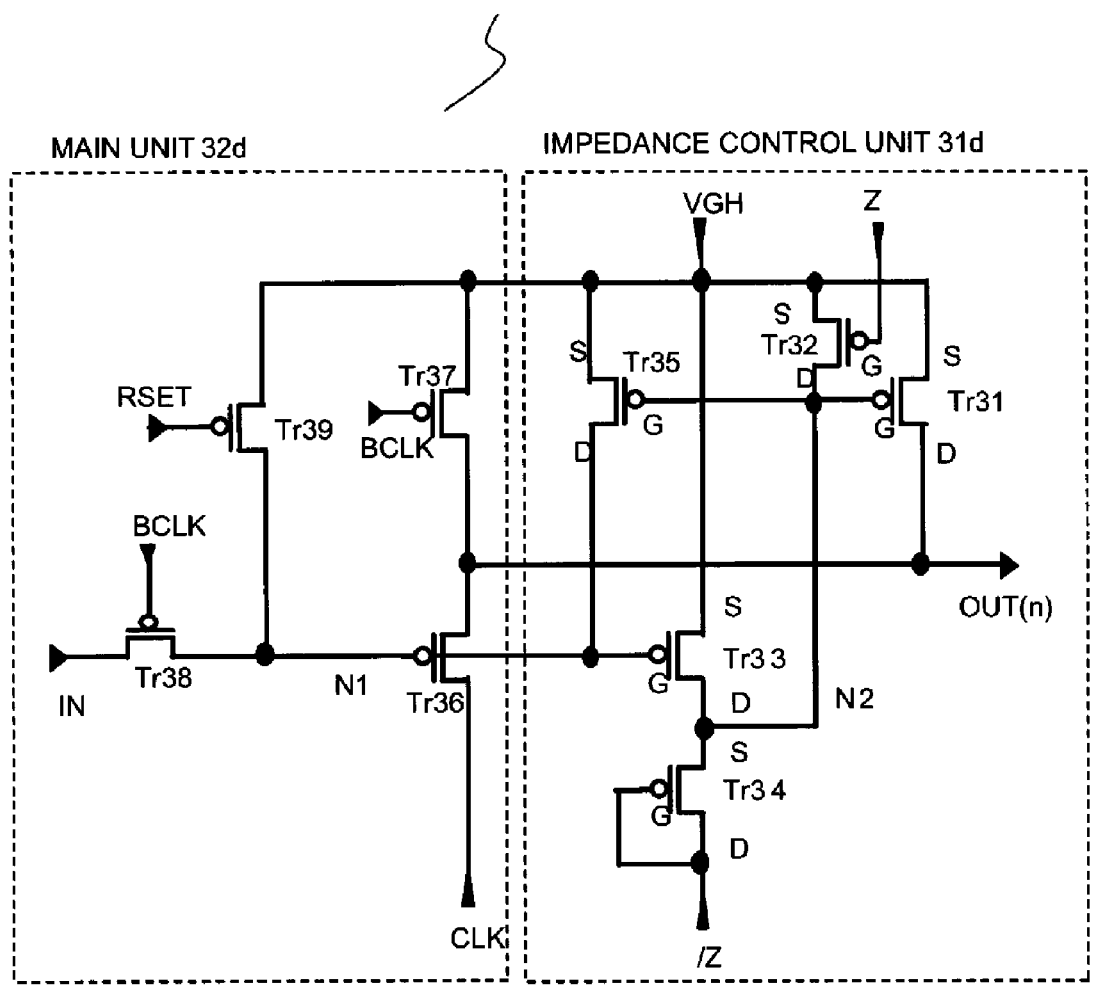
FIG. 9 is a circuit diagram showing a configuration of a one-stage shift register according to a sixth exemplary embodiment.

A one-stage shift register according to a sixth exemplary embodiment will be described with reference to the drawings. FIG. 9 is a circuit diagram showing a configuration of a one-stage shift register 33d according to the present exemplary embodiment.

The one-stage shift register 33c (in FIG. 5) in the third exemplary embodiment includes only the N-channel transistors. On the other hand, this one-stage shift register may include only P-channel transistors. Referring to FIG. 9, the one-stage shift register 33d in the present exemplary embodiment includes only P-channel transistors Tr31 to Tr39.

An operation of the one-stage shift register 33d (in FIG. 9) configured to include only the P-channel transistors can be explained as an operation in which an internal node voltage and an input signal have been inverted in the one-stage shift register 33c (in FIG. 5) including only the N-channel transistors.

Seventh Exemplary Embodiment

A display device according to a seventh exemplary embodiment will be described with reference to a drawing. Herein, a description will be directed to a case where a scanning line driving circuit including the shift register in the fourth or fifth exemplary embodiment is applied to the display device.

Figure 10:
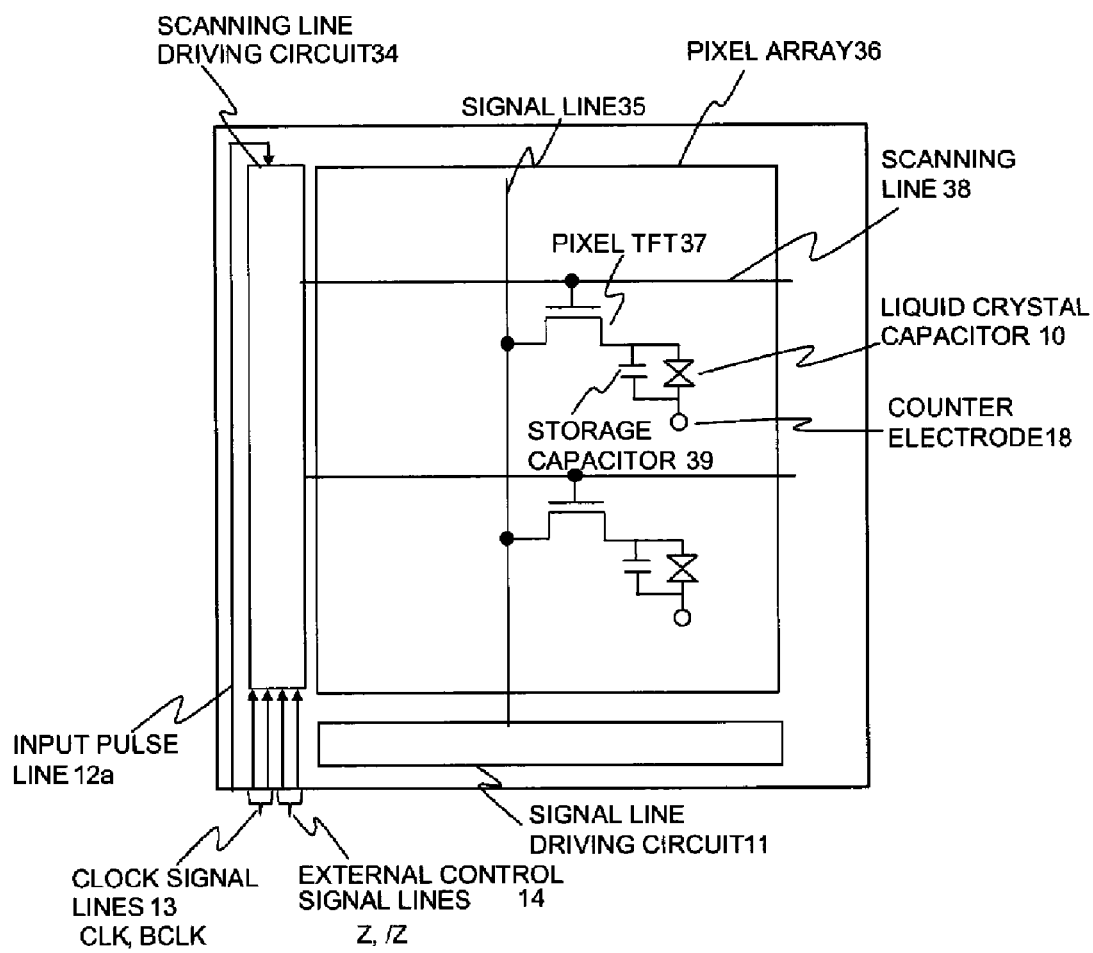
FIG. 10 is a block diagram showing a configuration of a display device according to a seventh exemplary embodiment.

FIG. 10 is a block diagram showing a configuration of the display device according to the present exemplary embodiment. Referring to FIG. 10, the display device includes a pixel array 36, scanning lines 38, signal lines 35, a scanning line driving circuit 34, and a signal line driving circuit 11. The scanning line driving circuit 34 is controlled by an input pulse line 12a, clock signal lines (CLK, BCKL) 13, and external control signal lines (Z, /Z) 14.

Each pixel included in the pixel array 36 includes a pixel TFT 37, a storage capacitor 39, and a liquid crystal capacitor 10. A corresponding one of the scanning lines 38 is connected to a gate electrode of the pixel TFT 37, a corresponding one of the signal lines is connected to one of source and drain electrodes of the pixel TFT 37, and one ends of the liquid crystal capacitor 10 and the storage capacitor 39 are connected to the other end of the source and drain electrodes of the pixel TFT 37. The other ends of the storage capacitor 39 and the liquid crystal capacitor 10 are connected to a counter electrode 18.

When the pixel array 36 of the display device is driven, a pulse is usually applied to each of the scanning lines from above on the page of FIG. 10 sequentially. The pixel TFT 37 connected to the corresponding one of the scanning lines 38 is turned on, and an image signal is written into the storage capacitor 39 and the liquid crystal capacitor 10 from the signal line driving circuit 11.

In the display device in FIG. 10, the driving pulse described above is generated by the scanning line driving circuit 34 formed of amorphous silicon TFTs.

The signal line driving circuit 11 may be mounted as a chip on glass (COG: Chip on Glass) or may be integrated on a glass substrate using TFTs.

Eighth Exemplary Embodiment

Figure 11:
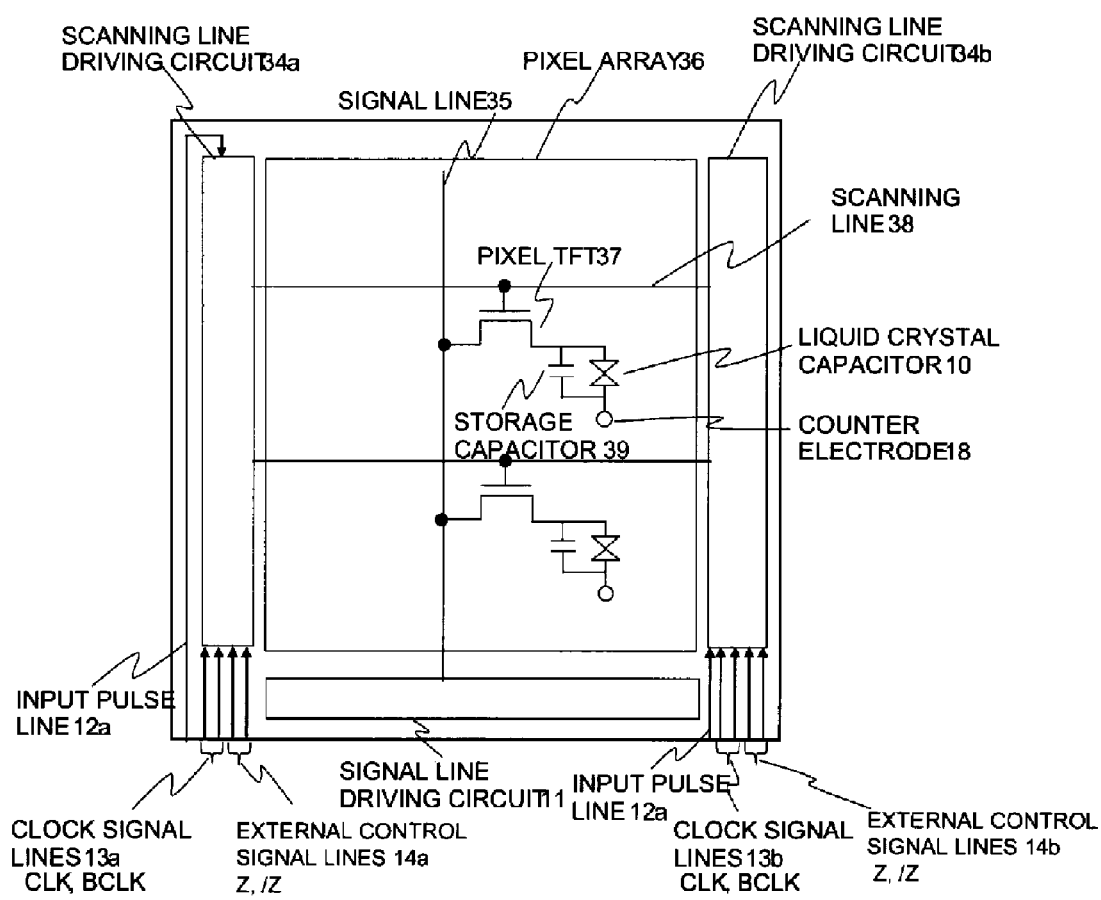
FIG. 11 is a block diagram showing a configuration of a display device according to an eighth exemplary embodiment.

A display device according to an eighth exemplary embodiment will be described with reference to the drawings. FIG. 11 is a block diagram showing a configuration of the display device according to the present exemplary embodiment. Referring to FIG. 11, the display device includes a pixel array 36, scanning lines 38, signal lines 35, scanning line driving circuits 34a and 34b, and a signal line driving circuit 11. The scanning line driving circuits 34a and 34b are controlled by input pulse line 12a, 12b; clock signal lines (CLK, BCLK) 13a, 13b; and external control signal lines (Z, /Z) 14a, 14b, respectively.

The pixel array 36 in the present exemplary embodiment is the same as the pixel array 36 in FIG. 10.

The display device in the present exemplary embodiment includes the two scanning line driving circuits 34a and 34b having different scanning directions on left and right sides of the display device on the page of FIG. 11. The scanning direction of the display device can be thereby reversed. Each of the scanning line driving circuits 34a and 34b includes the shift register according to the fourth or fifth exemplary embodiment. The scanning line driving circuit 34a is disposed so that scanning is performed from above in the drawing, and the scanning line driving circuit 34b is disposed so that scanning is performed from below in the drawing.

Next, operations of the scanning line driving circuits 34a and 34b will be described. When scanning of the display device from above is to be performed, clock signals are supplied to clock signal lines 13a and 13b and external control signals are supplied to external control signal lines 14a and 14b so that the scanning line driving circuit 34a is brought into a low-impedance state and a scanning line driving circuit 34b is brought into a high-impedance state. On the other hand, when scanning of the display device from below is to be performed, the scanning line driving circuit 34a is brought into a high-impedance state, and the scanning line driving circuit 34b is brought into a low-impedance state.

Ninth Exemplary Embodiment

Figure 12:
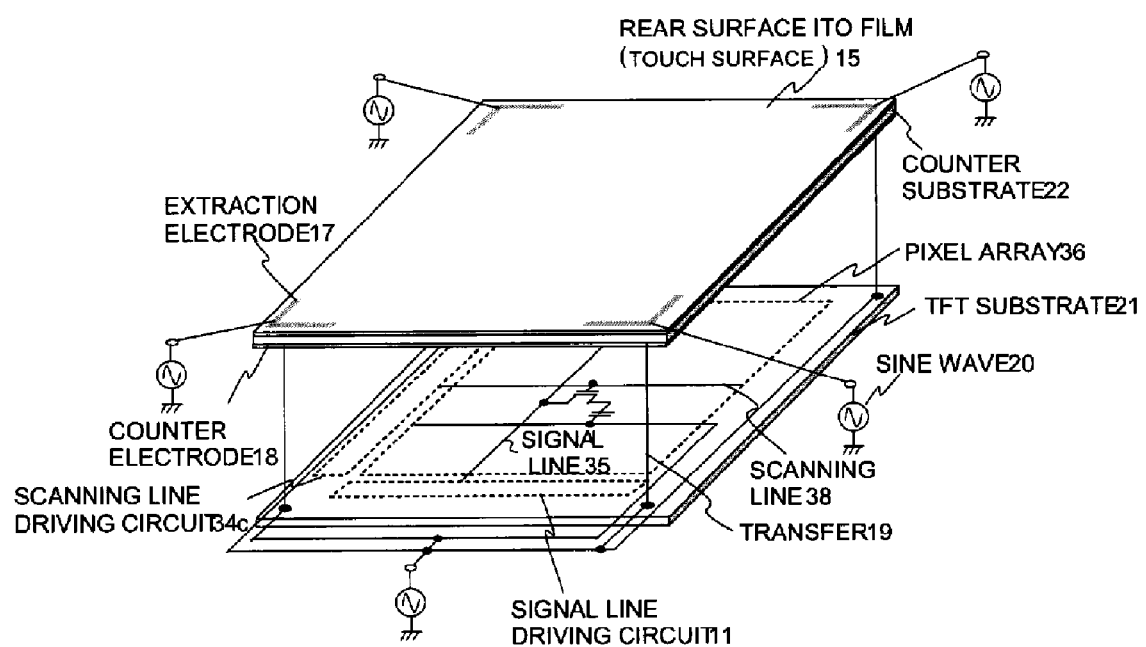
FIG. 12 is a block diagram showing a configuration of a display device according to a ninth exemplary embodiment.

A display device according to a ninth exemplary embodiment will be described with reference to the drawings. FIG. 12 is a block diagram showing a configuration of the display device according to the present exemplary embodiment. The display device in the present exemplary embodiment further includes a touch function compared with the display device in each of the display devices in the above-mentioned exemplary embodiments. Referring to FIG. 12, the display device in the present exemplary embodiment includes a pixel array 36, scanning lines 38, signal lines 35, a scanning line driving circuit 34c, a signal line driving circuit 11, a counter electrode 18, a transfer 19, a TFT substrate 21, a counter substrate 22, and a rear surface ITO film 15.

The scanning line driving circuit 34c includes the shift register in the fourth or fifth exemplary embodiment. The pixel array 36 and the signal line driving circuit 11 respectively indicate the same pixel array and signal line driving circuit as those in the seventh or eighth exemplary embodiment.

The rear surface ITO film 15 is an ITO (Indium Tin Oxide) film formed on the rear surface of the counter electrode 18, and is used as an electrode for detecting a touch position.

The display device including the touch function according to the ninth exemplary embodiment detects the position by detecting current that flows through a capacitor formed between the rear surface ITO film 15 and a finger that has touched the rear surface ITO film. Accordingly, the larger the capacitance between the rear surface ITO film 15 and the finger is, the more the current that flows through the capacitor is, and the higher detection sensitivity is. That is, a parasitic capacitance other than the capacitor formed between the rear surface ITO film and the finger should be small. However, in a related-art display device including the touch function, the parasitic capacitance between the counter electrode 18 or the rear surface ITO film 15 and each scanning line 38 on the TFT substrate is large. Thus, there is a problem of reduction of the detection sensitivity.

According to the display device in the present exemplary embodiment, by bringing the scanning line 38 into a high-impedance state using the scanning line driving circuit 34*c* including the shift register according to the fourth or fifth exemplary embodiment, the parasitic capacitance can be reduced, and the detection sensitivity can be thereby improved.

In the exemplary embodiments described above, the TFTs were set to the amorphous silicon TFTs. Other TFTs may be employed if the TFTs are of the same conductivity type. As the TFTs, for example, organic TFTs, carbon nanotube TFTs, or oxide semiconductor TFTs may also be employed.

Preferably, the oxide semiconductor TFTs are used for the one-stage shift register 33*d* (in FIG. 9) in the sixth exemplary embodiment. By using the one-stage shift register 33*d* in FIG. 9 and using the pixel TFTs of the same P-channel type, various advantages of the use of the oxide semiconductor TFTs as follows can be enjoyed. The advantages are that the oxide semiconductor TFTs are transparent, a comparatively low temperature process can be used, and an increase in the area of the display device is easy.

According to the display device (in FIG. 12) including the touch function in the ninth exemplary embodiment, a portion that implements the touch function is formed of the IOT film 15 and is transparent. Then, by configuring a display portion to be transparent, a see-through type display device including the touch function can be implemented. It should be noted that other objects, features and aspects of the present invention will become apparent in the entire disclosure and that modifications may be done without departing the gist and scope of the present invention as disclosed herein and claimed as appended herewith. Also it should be noted that any combination of the disclosed and/or claimed elements, matters and/or items may fall under the modifications aforementioned.

What is claimed is:

1. A one-stage shift register comprising:
   a first transistor with a drain electrode thereof connected to a corresponding one of scanning lines and with a source electrode thereof connected to a power supply;
   a second transistor of a same conductivity type as the first transistor, with a drain electrode thereof coupled to a common node with a gate electrode of the first transistor, with a source electrode thereof connected to the power supply, and with a gate electrode thereof connected to a first external control signal line;
   a third transistor of the same conductivity type as the first transistor, with a drain electrode thereof coupled to the common node of the drain electrode of the second transistor, with a source electrode thereof connected to the power supply, and with a gate electrode thereof connected to a node that uses a bootstrap effect; and
   a load circuit with one end thereof connected to a second external control signal line and with the other end thereof connected to the drain electrode of the second transistor.

2. The one-stage shift register according to claim 1, further comprising:
   a fourth transistor of the same conductivity type as the first transistor, with a drain electrode thereof connected to the gate electrode of the third transistor, with a source electrode thereof connected to the power supply, and with a gate electrode thereof connected to the drain electrode of the third transistor.

3. The one-stage shift register according to claim 1, wherein mutually complementary signals are respectively supplied to the first external control signal line and the second external control line to control an impedance of the corresponding one of scanning lines.

4. A shift register comprising the one-stage shift register as set forth in claim 1 in each stage.

5. The one-stage shift register according to claim 1, wherein the load circuit comprises a fourth transistor of the same conductivity type as the first transistor, with a drain electrode thereof and a gate electrode thereof both connected to the second external control signal line and with a source electrode thereof connected to the drain electrode of the second transistor.

6. The one-stage shift register according to claim 5, further comprising:
   a fifth transistor of the same conductivity type as the first transistor, with a drain electrode thereof connected to the gate electrode of the third transistor, with a source electrode thereof connected to the power supply, and with a gate electrode thereof connected to the drain electrode of the third transistor.

7. A shift register comprising a plurality of the one-stage shift registers as set forth in claim 1.

8. A scanning line driving circuit comprising the shift register as set forth in claim 7.

9. A display device comprising the scanning line driving circuit as set forth in claim 8.

10. The display device according to claim 9, wherein the display device detects a position touched by a finger in the display area of the display device.

11. A scanning line driving method comprising:
    controlling signals supplied respectively to the first and second external control signal lines; and
    bringing a scanning line of the display device as set forth in claim 9 into a floating state.

12. The display device according to claim 9, wherein two of the scanning line driving circuits are connected for each of the scanning lines.

13. The display device according to claim 12, wherein the two scanning line driving circuits are disposed to face to each other with a display area sandwiched therebetween, and one of the two scanning line driving circuits is driven active, the scanning lines being wired in the display area.

14. The display device according to claim 12, wherein scanning directions of the two scanning line driving circuits are disposed to be opposite to each other.

15. The display device according to claim 14, wherein a scanning direction of the display device is reversed, using the first and second external control signal lines.

* * * * *